United States Patent [19]
Davis, III

[11] Patent Number: 5,901,279
[45] Date of Patent: May 4, 1999

[54] CONNECTION OF SPARES BETWEEN MULTIPLE PROGRAMMABLE DEVICES

[75] Inventor: Robert W. Davis, III, Woodbine, Md.

[73] Assignee: Hughes Electronics Corporation, El Segundo, Calif.

[21] Appl. No.: 08/730,860

[22] Filed: Oct. 18, 1996

[51] Int. Cl.$^6$ ............ G06F 13/00; H01L 27/10; H01R 9/09

[52] U.S. Cl. ............ 395/182.01; 326/39; 439/55; 257/202

[58] Field of Search ............ 395/182.01; 257/202; 326/37, 39, 52, 104; 439/55, 60

[56] References Cited

U.S. PATENT DOCUMENTS

| | | | |
|---|---|---|---|
| 5,426,378 | 6/1995 | Ong | 326/39 |
| 5,432,708 | 7/1995 | Mohsen | 364/490 |
| 5,477,165 | 12/1995 | ElAyat et al. | 326/38 |
| 5,498,978 | 3/1996 | Takahashi et al. | 326/38 |
| 5,512,765 | 4/1996 | Gaverick | 257/202 |
| 5,539,331 | 7/1996 | Hatori et al. | 326/41 |
| 5,572,198 | 11/1996 | Sturges | 340/827 |

*Primary Examiner*—Joseph E. Palys
*Assistant Examiner*—Norman Michael Wright
*Attorney, Agent, or Firm*—John T. Whelan; Michael W. Sales

[57] ABSTRACT

A method of coupling logic devices using spares. A first logic device is coupled to a second logic device using a first plurality of spares. The first logic device is coupled to a third logic device using a second plurality of spares. The second logic device is coupled programmatically to the third logic device by coupling programmatically one of the first plurality of spares to one of the second plurality of spares via the first logic device. The coupling of the first logic device to the second logic device and the coupling of the first logic device to the third logic device comprise coupling a total number of spares not exceeding M(N−1), wherein M is a minimum number of spares that must be coupleable between each potential pair of logic devices in a multiplicity of logic devices, and wherein N is a total number of logic devices in the multiplicity of logic devices.

10 Claims, 2 Drawing Sheets

CONNECTION OF SPARES BETWEEN MULTIPLE PROGRAMMABLE DEVICES

BACKGROUND OF THE INTENTION

The present invention relates to the connection of spares between multiple programmable devices, and more particularly to the connection of spares between three or more such devices.

Complex signal processing, and other complex processing applications frequently employ multiple complex programmable logic devices on a single printed circuit board. While each of the complex logic devices frequently has one-hundred or more conductive pins to which electrical interconnections can be made, each of which can be programmatically designated for use as an input or an output, or both, the printed circuit board, itself, must be laid out in accordance with the particular functions to be carried out by the complex programmable logic devices.

For example, on a transmit/receive controller used in an Intelsat TDMA earth station, which is employed in large scale satellite communications, ten field programmable gate arrays may be employed in combination on a single printed circuit board in order to format signal bursts, perform forward error correction coding, perform digital signal processing necessary to detect, error correct and route bursts, and other digital transmit and receive functions. While the field programmable gate arrays can be programmed, and reprogrammed, in order to debug, or update their programming, the electrical interconnections provided on the printed circuit board on which the field programmable gate arrays are connected are fixed at the time the printed circuit board is made.

In order to accommodate additional electrical interconnections that may be needed as the programming in the field programmable gate arrays is updated, "spare" electrical interconnections have frequently heretofore been made between each of the field programmable gate arrays on the printed circuit board. Unfortunately, if just five additional interconnect wires are made between each of 10 field programmable gate arrays, this results in an additional 225 electrical interconnections that must be made on the printed circuit board. (In addition to the interconnections already needed to implement whatever functions are to be performed by the field programmable gate arrays). Furthermore, five additional electrical interconnections, problematically, may be too many additional interconnections between some of the field programmable gate arrays, (i.e., may be more than will ultimately be needed once the programming in the field programmable gate arrays is updated) and may be far too few additional interconnections between others of the field programmable gate arrays, (i.e., may be less than will ultimately be needed) depending on the changes in programming that are made in the future to the field programmable gate arrays. Nonetheless, the above approach requires the addition of 225 additional electrical interconnections, and therefore, poses a significant design burden on the printed circuit board designer.

The present invention advantageously addresses the above and other needs.

SUMMARY OF THE INVENTION

The present invention advantageously addresses the needs above as well as other needs by providing an improved approach to the interconnection of complex programmable logic devices using spares.

In one embodiment, the present invention can be characterized as a method of coupling logic devices using spares. The method employs the steps of coupling a first logic device to a to a second logic device using a first plurality of spares; coupling the first logic device to a third logic device using a second plurality of spares; and coupling programmatically the second logic device to the third logic device comprising coupling programmatically one of the first plurality of spares to one of the second plurality of spares via the first logic device.

In one variation of such embodiment, the first logic device may be a first field programmable gate array, the second logic device may be a second field programmable gate array, and the third logic device may be third field programmable gate array. In other variations, the logic devices may be read only memories, including erasable programmable read only memories, programmable logic arrays, programmable array logics, field programmable logic arrays, microprocessors or microcontrollers, programmable system controllers, control store sequencers, integrated circuit sequence controllers, or the like.

In another variation of the above embodiment, the method involves connecting the first logic device to a printed circuit board; connecting the second logic device to the printed circuit board; and connecting the third logic device to the printed circuit board. In such variation, the first plurality of conductors are associated with the printed circuit board; and the second plurality of conductors are associated with the printed circuit board.

In another embodiment, the invention can be characterized as a system for coupling logic devices using spares. The system has a first logic device; a first plurality of spares coupled to the first logic device; a second logic device coupled to the first plurality of spares; a second plurality of spares; and a third logic device coupled to the second plurality of spares. Within the first logic device, the second and third logic device can be programmatically coupled together using one of the first plurality of spares, one of the second plurality of spares, and the first logic device.

In a variation of the present embodiment, the first logic device includes a first field programmable gate array; the second logic device includes a second field programmable gate array; and the third logic device includes a third field programmable gate array. Other logic devices, such as those enumerated above may be used in further variations.

In another variation, a printed circuit board is connected to the first logic device, the second logic device and the third logic device. The printed circuit board is associated with the first plurality of spares and the second plurality of spares, both of which are preferably located thereon or therein.

In an additional variation, a total number of spares not exceeding M(N−1), wherein M is a minimum number of spares that must be coupleable between each potential pair of logic device in a multiplicity of logic devices connected to the printed circuit board, and wherein N is a total number of logic devices in the multiplicity of logic devices.

BRIEF DESCRIPTION OF THE DRAWINGS

The above and other aspects, features and advantages of the present invention will be more apparent from the following more particular description thereof, presented in conjunction with the following drawings wherein.

Corresponding reference characters indicate corresponding components throughout the several views of the drawings.

DETAILED DESCRIPTION OF THE PREFERRED EMBODIMENTS

The following description of the presently contemplated best mode of practicing the invention is not to be taken in a limiting sense, but is made merely for the purpose of describing the general principles of the invention. The scope of the invention should be determined with reference to the claims.

Figure 1:
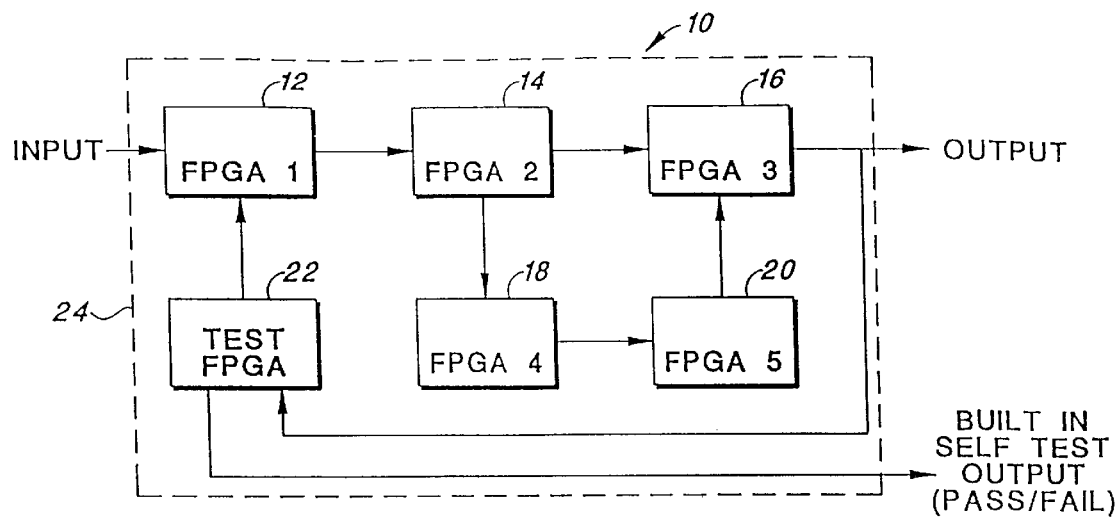
FIG. 1 is a block diagram of an exemplary complex signal processing system employing field programmable gate arrays on a printed circuit board.

Referring to FIG. 1, a block diagram is shown of an exemplary complex signal processing system 10 employing six field programmable gate arrays 12, 14, 16, 18, 20, 22. An input is received by a first of the field programmable gate arrays 12, processed and passed to the second of the field programmable gate arrays 14 via a plurality of conductors coupled thereinbetween. A printed circuit board 24 with which the conductors are associated, i.e., on which or in which the conductors are fabricated, is represented in FIG. 1 using a dashed line. The second of the field programmable gate arrays 14, further processes the input signal, and generates outputs that are passed to a third and a fourth of the field programmable gate arrays 16, 18 via additional printed circuit board conductors coupled thereinbetween. An output of the fourth of the field programmable gate arrays 18 is passed to a fifth of the field programmable gate arrays 20 via further printed circuit board conductors coupling the fourth and fifth field programmable gate arrays 18, 20 together, and an output of the fifth of the field programmable gate arrays 20 is passed to the third of the field programmable gate arrays 16 by other printed circuit board conductors coupled thereinbetween. A system output is generated by the third of the field programmable gate arrays 16, and is fed back to a test field programmable gate array 22 via additional printed circuit board conductors coupled between the third and test field programmable gate arrays 16, 22. The test field programmable gate array 22 generates a test input, which is passed by more printed circuit board conductors to the first of the field programmable gate arrays 12, and generates a self-test output indicative of whether or not a self-test is passed or failed.

All of the various signals passed between the field programmable gate arrays 12, 14, 16, 18, 20, 22 are passed on a plurality of conductors coupled thereinbetween, preferably on a printed circuit board (not shown).

Each of the field programmable gate arrays 12, 14, 16, 18, 20, 22 contains a program in response to which it operates in accordance with the functionality of the complex signal processing system 20. Advantageously, as user needs change, and, for example, technological advancements permit, programming within each of the field programmable gate arrays 12, 14, 16, 18, 20, 22 can be updated. Similarly, in the event "bugs" are discovered in the programming in any of the field programmable gate arrays 12, 14, 16, 18, 20, 22, such programming can be updated by reprogramming the field programmable gate arrays 12, 14, 16, 18, 20, 22 in accordance with well known technologies.

Unfortunately, while the programming can easily be updated in each of the field programmable gate arrays 12, 14, 16, 18, 20, 22, the number of conductors, or signal lines coupling each of the field programmable gate arrays 12, 14, 16, 18, 20, 22 to others of the field programmable gate arrays 12, 14, 16, 18, 20, 22, cannot easily be updated due to the permanent nature of the printed circuit boards on which electrical connections between the field programmable field arrays are made.

Figure 2:
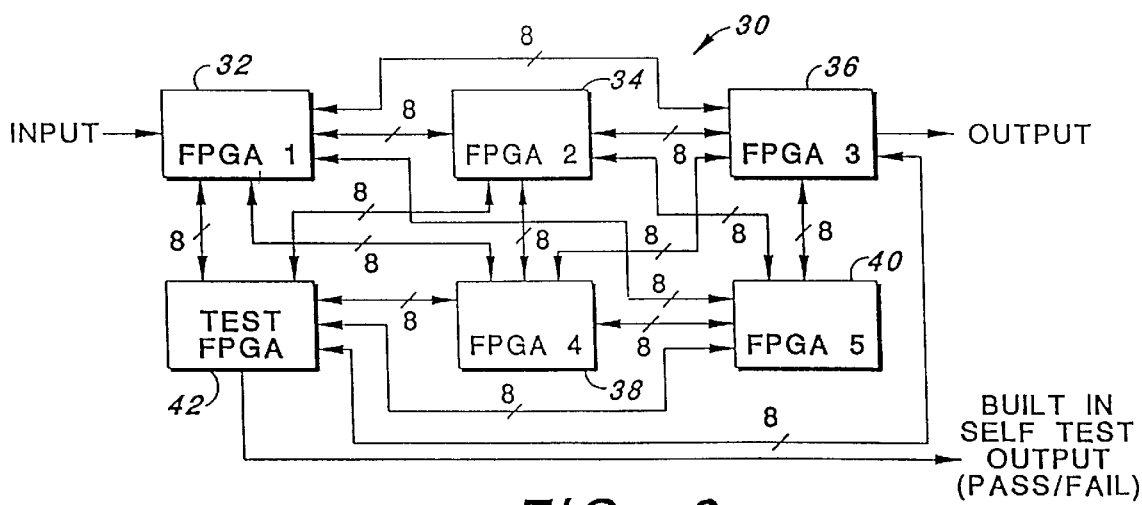
FIG. 2 is a block diagram of a complex signal processing system in which six field programmable gate arrays are coupled with a plurality of spares between each of the field programmable gate arrays.

Referring to FIG. 2, a block diagram is shown of a complex signal processing system 30 in which six programmable gate arrays 32, 34, 36, 38, 40, 42 are coupled with a plurality of initially unused conductors, or "spares", coupling each of the field programmable gate arrays 32, 34, 36, 38, 40, 42, to each of the other field programmable gate arrays 32, 34, 36, 38, 40, 42, in accordance with the prior art.

In addition to the "spares" shown, other conductors, not shown for the sake of simplicity, couple each of the field programmable gate arrays 32, 34, 36, 38, 40, 42 to one or more of the other field programmable gate arrays 32, 34, 36, 38, 40, 42. These other conductors are coupled between the field programmable gate arrays 32, 34, 36, 38, 40, 42 in accordance with the functions to be carried out by the complex signal processing system 30. For example, these other conductors may be similar in arrangement to the conductors described above and shown in FIG. 1 coupling the field programmable gate arrays 12, 14, 16, 18, 20, 22 to one another. (Also not shown in FIG. 2 for the sake of simplicity is the printed circuit board 24 of FIG. 1).

Thus, in addition to conductors similar to those shown in FIG. 1, a number of initially unused conductors or "spares" are shown and are available between each of the field programmable gate arrays 32, 34, 36, 38, 40, 42 and each of the other field programmable gate arrays 32, 34, 38, 40, 42. As a result, should the need arise for additional conductors or signal lines between any two of the field programmable gate arrays 32, 34, 36, 38, 40, 42 such need can be accommodated without redesigning the printed circuit board on which the field programmable gate arrays 32, 34, 36, 38, 40, 42 are connected and without resorting to the use of "jumper" wires, which must be soldered between connectors on the field programmable gate arrays 32, 34, 36, 38, 40, 42 needing to be connected to one another.

Unfortunately, it is impossible to predict what additional conductors or signal lines might be needed between any two of the field programmable gate arrays 32, 34, 36, 38, 40, 42 at the time the printed circuit board is designed. This inability to predict the numbers and interconnections needed has heretofore made it necessary to add a number of "spares" between each and every one of the field programmable gate arrays 32, 34, 36, 38, 40, 42 in excess of the number that might be needed. Disadvantageously, this results in an addition of additional electrical conductors on the printed circuit board, which greatly increases the complexity of the printed circuit board layout and design.

For example in the complex signal processing circuit shown in FIG. 2 more than one-hundred additional connections (one hundred twenty to be exact) must be made between the field programmable gate arrays 32, 34, 36, 38, 40, 42 in order to add just eight connections between each of the field programmable gate arrays 32, 34, 36, 38, 40, 42. For other systems involving a different number of field programmable gate arrays, or other complex programmable logic devices, the number of additional connections needed is $$M \sum_{n=1}^{N-1} (N-n),$$

where M is the number of spares desired, and N is the number of complex logic devices between which M spares are to be connected.

Figure 3:
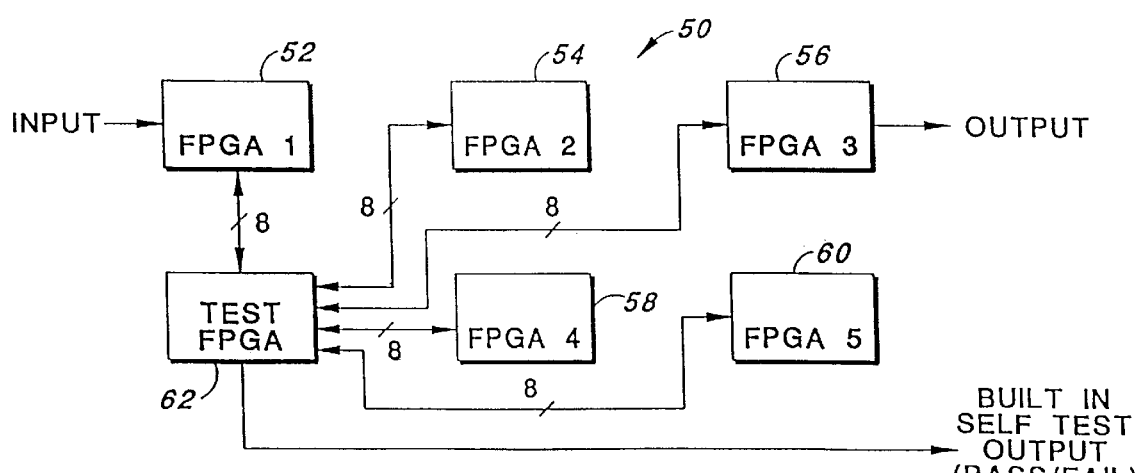
FIG. 3 is a block diagram of a complex signal processing system in which six field programmable gate arrays are coupled together using spares in accordance with one embodiment of the present invention.

Referring next to FIG. 3, a block diagram of a complex signal processing system 50 is shown in which six field programmable gate arrays 52, 54, 56, 58, 60, 62 are coupled in accordance with one embodiment of the present invention. In particular, eight "spares" are connected between each of a first, second, third, fourth and fifth of the field programmable gate arrays 52, 54, 56, 58, 60, respectively, and a test field programmable gate array 62. Within the test field programmable gate array 62, each of the eight "spares" from the first field programmable gate array 52, can be programmatically coupled to any of the eight "spares" from any of the other field programmable gate arrays 54, 56, 58, 60, 62. Such programmatical coupling is achieved by creating a logic function inside the test field programmable gate array 62 that performs the required interconnect. The logic function can be combinational or synchronous. In addition, the created logic function can be bidirectional or unidirectional (i.e., forward or reverse). As a result, the number of additional electrical conductors, i.e., spares, needed in the embodiment shown is forty, as opposed to more than one hundred with the embodiment shown in FIG. 2. For other systems involving a different number of field programmable logic devices, or other coupled logic devices, the number of additional connections needed in accordance with the present embodiment is M(N−1), where M is the number of spares needed and N is the number of complex logic devices between which such spares are to be made available.

In the embodiment of FIG. 3, a three-fold improvement in the number electrical corrections needed in order to provide eight potential "spares" between each and every one of the field programmable gate arrays 50, 52, 54, 56, 58, 60, 62 is achieved. For other systems, the improvement is $$\left( M \sum_{n=1}^{N-1} (N-n) \right) - M(N-1),$$

or $$M \sum_{n=1}^{N-1} (N-n).$$

This improvement may be reduced somewhat by a potential need to increase the number of spares, M, in view of the reduction in total spares on the printed circuit board, but, in all but the most extreme cases, such as where eight additional connections become needed between each and every complex logic device due to programming changes, the present embodiment provides a significant reduction in the number of additional connections that need to be made on the printed circuit board.

Thus, the present embodiment provides a solution to the problem of providing a number of spares between any of the field programmable gate arrays and any others of the field programmable gate arrays on, for example, a printed circuit board or in any environment where a limited number of connections must be made, without the need for providing discrete spares between each and every one of the field programmable gate arrays. As is stated above, this approach greatly reduces the number of additional electrical conductors that need to be put into the printed circuit board, and at the same time provides a number of "spares" desired between each of the field programmable gate arrays and each of the other field programmable gate arrays. Further advantageously, this reduction in the number of additional electrical conductors is due to the fact that the particular interconnection of the field programmable gate arrays through the "spares" does not need to be "hard wired" at the time the printed circuit board is designed but rather can be programmatically adjusted as needed to accommodate new programming in one or more of the field programmable gate arrays. This allows for maximum flexibility in signal assignment at minimal cost in terms of conductors. Advantageously, the electrical connectors of each of the field programmable gate arrays preferably are "bi-directional" (i.e., capable of acting as inputs and/or outputs), so the direction of the "spares" is also programmable.

While the invention herein disclosed has been described by means of specific embodiments and applications thereof, numerous modifications and variations could be made thereto by those skilled in the art without departing from the scope of the invention set forth in the claims.

What is claimed is:

1. A method of coupling logic devices using spares comprising:

coupling a first logic device to a second logic device using a first plurality of spares;

coupling the first logic device to a third logic device using a second plurality of spares;

coupling programmatically the second logic device to the third logic device comprising coupling programmatically one of the first plurality of spares to one of the second plurality of spares via the first logic device;

connecting said first logic device to a printed circuit board; and connecting said third logic device to the printed circuit board;

said coupling of said first logic device to said second logic device including coupling said first logic device to said second logic device using the first plurality of conductors, wherein the first plurality of conductors are associated with the printed circuit board;

said coupling of said first logic device to said third logic device including coupling said first logic device to said third logic device using the second first plurality of conductors, wherein the second plurality of conductors are associated with the printed circuit board; and wherein said coupling of said first logic device to said second logic device, and said coupling of said first logic device to said third logic device comprise coupling a total number of spares not exceeding M(N−1), wherein M is a minimum number of spares that must be coupleable between each potential pair of logic devices in a multiplicity of logic devices connected to said printed circuit board, and wherein N is a total number of logic devices in said multiplicity of logic devices.

2. A system for coupling logic devices using spares comprising:

a first logic device, a first plurality of spares coupled to the first logic device;

a second logic device coupled to the first plurality of spares;

a second plurality of spares coupled to the first logic device;

a third logic device coupled to the second plurality of spares;

means for programmatically coupling the second logic device to the third logic device using one of the first plurality of spares, one of the second plurality of spares, and the first logic device; and a printed circuit board connected to said first logic device, said second logic device, and said third logic device, the printed circuit board including said first plurality of spares and said second plurality of spares;

wherein said printed circuit board includes a total number of spares not exceeding M(N−1), wherein M is a minimum number of spares that must be coupleable between each potential pair of logic devices in a multiplicity of logic devices connected to said printed circuit board, and wherein N is a total number of logic devices in said multiplicity of logic devices.

3. A method of coupling logic devices using spares comprising:

coupling a first logic device to a second logic device using a first plurality of spares;

coupling the first logic device to a third logic device using a second plurality of spares;

coupling programmatically the second logic device to the third logic device comprising coupling programmatically one of the first plurality of spares to one of the second plurality of spares via the first logic device; and said coupling of said first logic device to said second logic device, and said coupling of said first logic device to said third logic device comprise coupling a total number of spares not exceeding M(N−1), wherein M is a minimum number of spares that must be coupleable between each potential pair of logic devices in a multiplicity of logic devices, and wherein N is a total number of logic devices in said multiplicity of logic devices.

4. The method of claim 3 further comprising coupling the first logic device to a fourth logic device using a third plurality of spares;

coupling programmatically the second logic device to the fourth logic device comprising coupling programmatically one of the first plurality of spares to one of the third plurality of spares via the first logic device.

5. The method of claim 3 wherein:

said coupling of said first logic device to said second logic device includes coupling a first field programmable gate array to a second field programmable gate array; and said coupling of said first logic device to said third logic device includes coupling the first field programmable gate array to a third field programmable gate array.

6. The method of claim 3 further comprising:

connecting said first logic device to a printed circuit board;

connecting said second logic device to the printed circuit board; and connecting said third logic device to the printed circuit board;

said coupling of said first logic device to said second logic device including coupling said first logic device to said second logic device using the first plurality of conductors, wherein the first plurality of conductors are associated with the printed circuit board; and said coupling of said first logic device to said third logic device including coupling said first logic device to said third logic device using the second first plurality of conductors, wherein the second plurality of conductors are associated with the printed circuit board.

7. A system for coupling logic devices using spares comprising:

a first logic device;

a first plurality of spares coupled to the first logic device;

a second logic device coupled to the first plurality of spares;

a second plurality of spares coupled to the first logic device;

a third logic device coupled to the second plurality of spares;

means for programmatically coupling the second logic device to the third logic device using one of the first plurality of spares, one of the second plurality of spares, and the first logic device; and a total number of spares not exceeding M(N−1), wherein M is a minimum number of spares that must be coupleable between each potential pair of logic devices in a multiplicity of logic devices, and wherein N is a total number of logic devices in said multiplicity of logic devices.

8. The system of claim 7 further comprising:

a third plurality of spares coupled to the first logic device;

a fourth logic device coupled to the third plurality of spares;

wherein said means for programmatically coupling includes means for coupling said second logic device to the fourth logic device using one of said first plurality of spares, one of said third plurality of spares, and said first logic device.

9. The system of claim 7 wherein:

said first logic device includes a first field programmable gate array;

said second logic device includes a second field programmable gate array; and said third logic device includes a third field programmable gate array.

10. The system of claim 7 further comprising:

a printed circuit board connected to said first logic device, said second logic device and said third logic device, the printed circuit board including said first plurality of spares and said second plurality of spares.

* * * * *